United States Patent
Lee et al.

(10) Patent No.: US 8,039,365 B2
(45) Date of Patent: Oct. 18, 2011

(54) INTEGRATED CIRCUIT PACKAGE SYSTEM INCLUDING WAFER LEVEL SPACER

(75) Inventors: Sang-Ho Lee, Kyounggi (KR);
Jong-Woo Ha, Seoul (KR); Soo-San Park, Seoul (KR)

(73) Assignee: Stats Chippac Ltd., Singapore (SG)

( * ) Notice: Subject to any disclaimer, the term of this patent is extended or adjusted under 35 U.S.C. 154(b) by 679 days.

(21) Appl. No.: 11/456,845

(22) Filed: Jul. 11, 2006

(65) Prior Publication Data
US 2008/0012095 A1 Jan. 17, 2008

(51) Int. Cl.
*H01L 21/00* (2006.01)
*H01L 23/02* (2006.01)

(52) U.S. Cl. ........................ 438/462; 257/678
(58) Field of Classification Search .................. 257/680, 257/686, 700, 704, 713, 777; 438/17, 110; 439/460, 462, 401
See application file for complete search history.

(56) References Cited

U.S. PATENT DOCUMENTS

| | | | |
|---|---|---|---|
| 5,323,060 A | 6/1994 | Fogal et al. | |
| 6,472,758 B1 | 10/2002 | Glenn et al. | |
| 6,569,709 B2 | 5/2003 | Derderian | |
| 6,812,049 B1 * | 11/2004 | Tracy | 438/17 |
| 6,916,686 B2 * | 7/2005 | Wada et al. | 438/118 |
| 6,933,172 B2 | 8/2005 | Tomimatsu | |
| 7,129,110 B1 | 10/2006 | Shibata | |
| 2003/0164549 A1 * | 9/2003 | Nakayama | 257/777 |
| 2003/0178710 A1 | 9/2003 | Kang et al. | |
| 2005/0224959 A1 | 10/2005 | Kwon et al. | |
| 2005/0230800 A1 * | 10/2005 | Do et al. | 257/686 |
| 2005/0277228 A1 * | 12/2005 | Lee | 438/113 |
| 2005/0285610 A1 * | 12/2005 | Ma | 324/756 |

OTHER PUBLICATIONS

Definition of 'boundary', "Merriam-Webster's Collegiate Dictionary", 1994, p. 135, Tenth Edition, Publisher: Merriam-Webster, Incorporated, Published in: Springfield, MA, USA.

* cited by examiner

*Primary Examiner* — Thomas L Dickey
*Assistant Examiner* — Nikolay Yushin
(74) *Attorney, Agent, or Firm* — Mikio Ishimaru

(57) ABSTRACT

An integrated circuit package system that includes providing a wafer level spacer including apertures, which define unit spacers that are interconnected, and configuring the unit spacers to substantially align over devices formed within a substrate.

19 Claims, 6 Drawing Sheets

INTEGRATED CIRCUIT PACKAGE SYSTEM INCLUDING WAFER LEVEL SPACER

CROSS-REFERENCE TO RELATED APPLICATION

The present application contains subject matter related to co-pending U.S. patent application Ser. No. 11/465,706, filed Aug. 18, 2006.

TECHNICAL FIELD

The present invention relates generally to integrated circuits, and more particularly to integrated circuit package systems.

BACKGROUND ART

Integrated circuits are what power many of today's consumer electronics, for instance, cellphones, video cameras, portable music players, computers, etc. As customer demand improves integrated circuit performance, faster, more reliable, and higher-density circuits, need to be produced at a lower cost. Packaging goals of the future for these integrated circuits will be met by increasing the density of chips while reducing the number of internal electrical interconnections. Packaging with fewer interconnects can potentially shorten the circuit length, decreases potential failure points, reduce circuit resistance, and reduce inter-line capacitance or crosstalk. Various techniques, such as, flip chip, gall grid array (BGA), chip on board (COB), and multi-chip modules (MCM), have been developed to meet the continued demands for improving integrated circuit system performance.

For even higher density applications, package assemblies including stacked die configurations have been employed. For example, some stacked die configurations employ an upper die that is sufficiently smaller than a lower die, and therefore, allow direct attachment of the two die. But in other instances the upper die is not sufficiently smaller than the lower die and the use of spacers must be employed.

Spacers can be embodied in many forms. For example, spacers may include dummy semiconductor die (e.g.—semiconductor die without electrical circuitry) or adhesive layers containing spacer elements, such as micro-spheres. Unfortunately, many of these applications still suffer from bulky configurations, substrate warpage, electrical shorting, alignment difficulties, delamination, chip floating problems due to low viscosity adhesives, and low unit productivity because each spacer must be attached to each individual die.

Thus, a need still remains for a stacked device integrated circuit package system, which employs a wafer level spacer system that reduces fabrication complexities and provides a low cost alternative to previous methodologies. In view of the ever-increasing need to save costs and improve efficiencies, it is more and more critical that answers be found to these problems.

Solutions to these problems have been long sought but prior developments have not taught or suggested any solutions and, thus, solutions to these problems have long eluded those skilled in the art.

DISCLOSURE OF THE INVENTION

The present invention provides an integrated circuit package system, which includes providing a wafer level spacer including apertures, which define unit spacers that are interconnected, and configuring the unit spacers to substantially align over devices formed within a substrate.

Certain embodiments of the invention have other aspects in addition to or in place of those mentioned above. The aspects will become apparent to those skilled in the art from a reading of the following detailed description when taken with reference to the accompanying drawings.

BEST MODE FOR CARRYING OUT THE INVENTION

Figure 1:
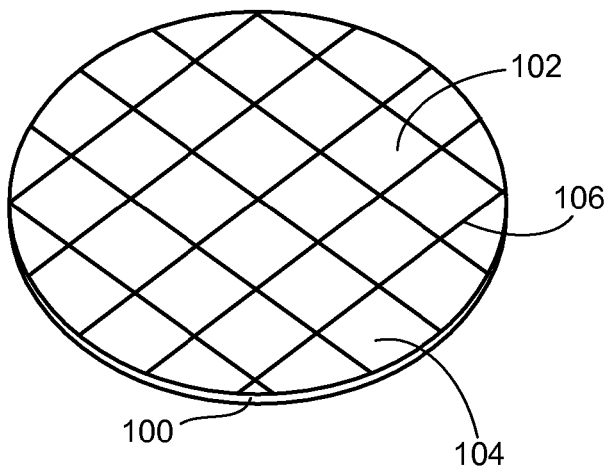
FIG. 1 is an isometric top view of a substrate in accordance with an embodiment of the present invention.

The following embodiments are described in sufficient detail to enable those skilled in the art to make and use the invention, and it is to be understood that other embodiments would be evident based on the present disclosure and that process or mechanical changes may be made without departing from the scope of the present invention.

In the following description, numerous specific details are given to provide a thorough understanding of the invention.

However, it will be apparent that the invention may be practiced without these specific details. In order to avoid obscuring the present invention, some well-known system configurations, and process steps are not disclosed in detail. Likewise, the drawings showing embodiments of the invention are semi-diagrammatic and not to scale and, particularly, some of the dimensions are for the clarity of presentation and are shown exaggerated in the drawing FIGs. In addition, where multiple embodiments are disclosed and described having some features in common, for clarity and ease of illustration, description, and comprehension thereof, similar and like features one to another will ordinarily be described with like reference numerals.

The term "horizontal" as used herein is defined as a plane parallel to the plane or surface of a substrate or wafer, regardless of its orientation. The term "vertical" refers to a direction perpendicular to the horizontal as just defined. Terms, such as "on", "above", "below", "bottom", "top", "side" (as in "sidewall"), "higher", "lower", "upper", "over", and "under", are defined with respect to the horizontal plane. The term "processing" as used herein includes deposition of material or photoresist, patterning, exposure, development, etching, cleaning, and/or removal of the material or photoresist as required in forming a described structure.

The present invention relates generally to semiconductor packaging employing a wafer level spacer between stacked die or packages. The wafer level spacer is a one-step wafer level process that can align and attach a unit spacer over each device formed on or within a wafer. The wafer level spacer of the present invention has many aspects.

For example, the wafer level spacer can reduce the overall stack-up height of a package, when compared to conventional stacking methods employing dummy spacer chips. The wafer level spacer also eliminates process steps by consolidating individual unit level spacer attach process steps into a single step wafer level spacer attach process. By eliminating costly time consuming process steps, the single step wafer level spacer attach process reduces production time and cost. Additionally, the wafer level spacer helps to prevent substrate or package warpage failure by adding supplementary support to the structure. Moreover, the wafer level spacer can also act as a heat spreader and thereby enhance thermal dissipation of heat.

Referring now to FIG. 1, therein is shown an isometric top view of a substrate 100 in accordance with an embodiment of the present invention. The substrate 100 can be fabricated from ceramics, silicon, silicon based composites, plastics, laminates of various types (organic or inorganic), or a combination thereof, which are compatible chemically, thermally, and mechanically with the process conditions chosen for the integrated circuit package design. As an exemplary illustration the substrate 100 may include a semiconductor wafer whose dimensions are only limited by current wafer fabrication technology.

The substrate 100 includes device(s) 102, located within the fixed-quality area of the substrate 100, and partial devices 104 located within the exclusion zone along the periphery of the substrate 100. Although the substrate 100 depicts sixteen of the devices 102, it is to be understood that the substrate 100 may include any number of the devices 102 permissibly constructed within the fixed-quality area.

The devices 102 may include semiconductor chips and integrated circuit packages selected from active components, passive components, surface mount components, stacked components, and so forth, in numerous configurations and arrangements as may be needed.

By way of example and not by way of limitation, the devices 102 may more specifically include quad-flat non-leaded packages, wire bond packages, single and dual-side memory packages, internal stacking module packages, flip-chip packages, modular packages, application-specific-integrated-circuit (ASIC) packages, stacked die packages or a combination thereof. Furthermore, the devices 102 may further include, by way of example and not by way of limitation, wire bond die, flip-chip die, stacked die, modular die, ASIC die, passive devices or a combination thereof.

Additionally, the present invention includes semiconductor package configurations, such as package-in-package (PiP) and package-on-package configurations (PoP). The PiP system is a 3D package system that stacks a fully tested Internal Stacking Module (ISM) on top of a Base Assemble Package (BAP) to form a single Chip Scale Package (CSP). PoP is a 3D package in which fully tested packages are stacked on top of another single or stacked package during the board mount process. As an exemplary illustration, the devices 102 may include PiP and PoP configurations.

However, it is to be understood that the devices 102 of the present invention cover a wide range of package and die configurations, and the type of package or die configuration employed is only limited by the design specifications of the chosen integrated circuit package.

Formed between the devices 102 and the partial devices 104 are scribe lines 106. The scribe lines 106 provide a singulation path for cutting or lasing the substrate 100 into discrete components. Additionally, the scribe lines 106 may or may not contain scribe line monitors, which allow in-line parametric testing of the substrate 100 during fabrication.

After fabrication of the substrate 100, the substrate 100 may then be subjected to a wafer sort test. By way of example, the wafer sort test can help to verify, which of the devices 102 on the substrate 100 function properly. If any of the devices 102 are found defective, they are flagged within a database and either marked by an ink dot or located by an electronic wafer map program that creates a computer image of the devices 102 location.

Figure 2:
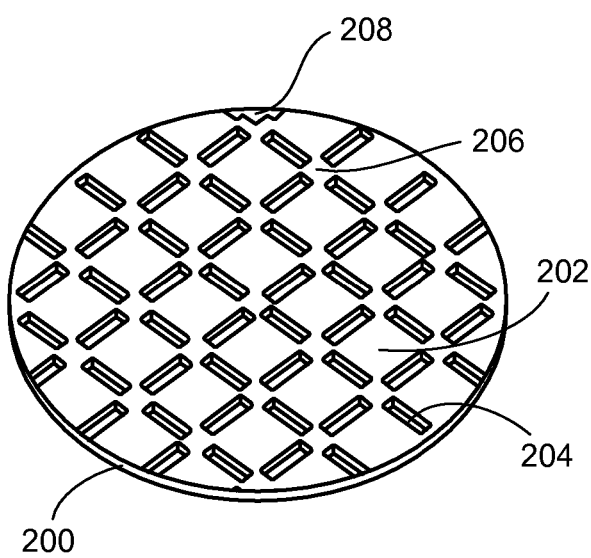
FIG. 2 is an isometric top view of a wafer level spacer in accordance with an embodiment of the present invention.

Referring now to FIG. 2, therein is shown an isometric top view of a wafer level spacer 200 in accordance with an embodiment of the present invention. The wafer level spacer 200 includes unit spacer(s) 202 and aperture(s) 204. The dimensions of the wafer level spacer 200 are designed to mirror those of the substrate 100, of FIG. 1.

The wafer level spacer 200 may be made from materials, such as metallics (e.g.—nickel plated copper), metal alloys, organics, ceramics, compliant materials, thermally conductive materials, or a combination thereof. However, it is to be understood that the type of material chosen for the wafer level spacer 200 is not critical.

In accordance with the scope of the present invention, the type of material chosen for the wafer level spacer 200 should include properties, such as enhanced structural support, potential electromagnetic interference reduction, and/or enhanced thermal dissipation of heat. As exemplary illustrations, properties such as enhanced structural support and electromagnetic interference reduction, can help to prevent warpage failure of the substrate 100 or the devices 102 and block electromagnetic radiation produced by the devices 102, respectively.

Generally, the wafer level spacer 200 is designed to provide a wafer overlay spacer system that can be placed over the substrate 100 in a single step. The wafer level spacer 200 eliminates the need to mount individual/separate spacers on each of the devices 102, of FIG. 1, in a multi-step process. The unity of the wafer level spacer 200 and its single-step application process are accomplished by interconnecting each of the unit spacers 202 with one another via interconnection points 206. In at least one embodiment, the unit spacers 202 are joined together via the interconnection points 206 made from material of the wafer level spacer 200. The interconnection points 206 and the unit spacers 202 are further defined by the apertures 204. By way of example and not by way of limitation, the apertures 204 can be processed by photolithography, wet etch, and/or dry etch process steps.

Although the present embodiment depicts the apertures 204 as rectangular in shape, it is not to be construed as limiting. It is to be understood that the shape of the apertures 204 is not essential, what is important is that the apertures 204 provide access to electrical contact points located on the devices 102. In accordance with the scope of the present invention the apertures 204 may take any shape, such as a circle, a rectangle, a square, an ellipse, a poly-sided opening, etc. Some exemplary shapes that the apertures 204 may take will be described in greater detail below in FIGS. 3-5.

Each of the unit spacers 202 is configured within or on the wafer level spacer 200 to substantially align over each of the devices 102 formed on or within the substrate 100. By mapping out the placement of each of the unit spacers 202 to mimic or mirror the placement of each of the devices 102, the wafer level spacer 200 provides a single-step wafer spacer substantially located over each of the devices 102. Although, the wafer level spacer 200 depicts sixteen of the unit spacers 202, it is to be understood that the wafer level spacer 200 may include any number of the unit spacers 202.

Additionally, a notch 208 can be placed along the edge of the wafer level spacer 200, which may contain identifying information such as crystal structure and wafer direction/orientation.

Figure 3:
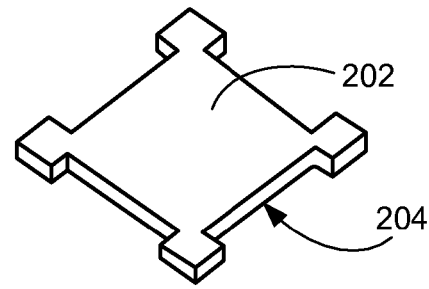
FIG. 3 is an isometric top view of a unit spacer in accordance with an embodiment of the present invention.
Figure 4:
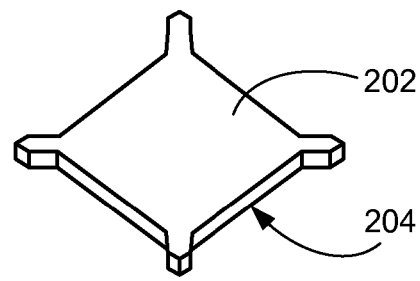
FIG. 4 is an isometric top view of a unit spacer in accordance with another embodiment of the present invention.
Figure 5:
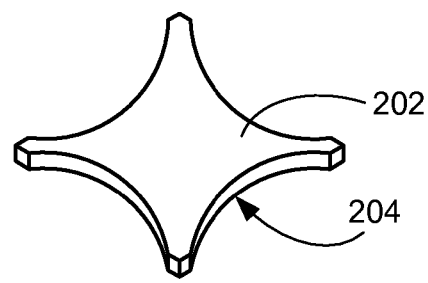
FIG. 5 is an isometric top view of a unit spacer in accordance with another embodiment of the present invention.

FIGS. 3-5 depict exemplary embodiments of the apertures 204 in accordance with aspects of the present invention; however, they are not to be construed as limiting.

Referring now to FIG. 3, therein is shown an isometric top view of the unit spacer 202 in accordance with an embodiment of the present invention. In accordance with the present embodiment, the apertures 204 formed along the perimeter of the unit spacer 202, are shaped as tetragons.

Referring now to FIG. 4, therein is shown an isometric top view of the unit spacer 202 in accordance with another embodiment of the present invention. In accordance with the present embodiment, the apertures 204 formed along the perimeter of the unit spacer 202, are shaped as trapezoids.

Referring now to FIG. 5, therein is shown an isometric top view of the unit spacer 202 in accordance with another embodiment of the present invention. In accordance with the present embodiment, the apertures 204 formed along the perimeter of the unit spacer 202, are shaped as ellipses.

Figure 6:
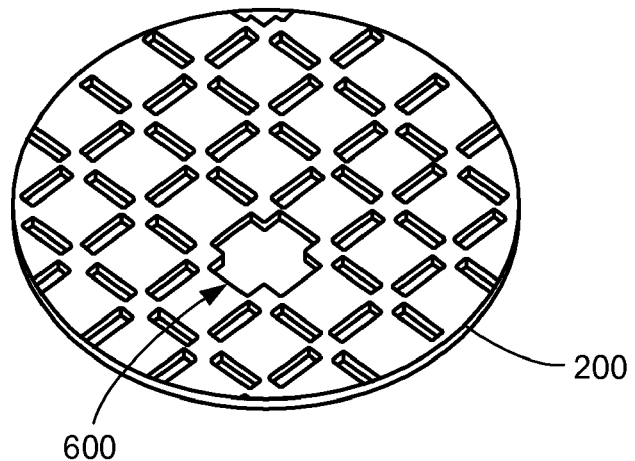
FIG. 6 is an isometric top view of a wafer level spacer in accordance with another embodiment of the present invention.

Referring now to FIG. 6, therein is shown an isometric top view of the wafer level spacer 200 in accordance with another embodiment of the present invention. Per this embodiment, the wafer level spacer 200 may employ one or more punch holes 600 that are formed before the wafer level spacer 200 is attached to the substrate 100, of FIG. 1. The punch holes 600 can be formed in regions that overlie the devices 102, of FIG. 1, found to be defective. For example, the punch hole 600 could be formed over one the devices 102 that have been marked with an ink dot, such that the defective device will be easily identifiable and not processed.

Furthermore, the corners of the punch holes 600 may act as eye-points for alignment purposes and as reference points for wafer mapping. By way of example, the punch hole 600 can allow an operator to observe any patterns formed on the substrate 100 and align the wafer level spacer 200 accordingly. Moreover, the corners of the punch hole 600 may act as points of reference that help to verify the location of good and bad die within an electronic wafer map.

Figure 7:
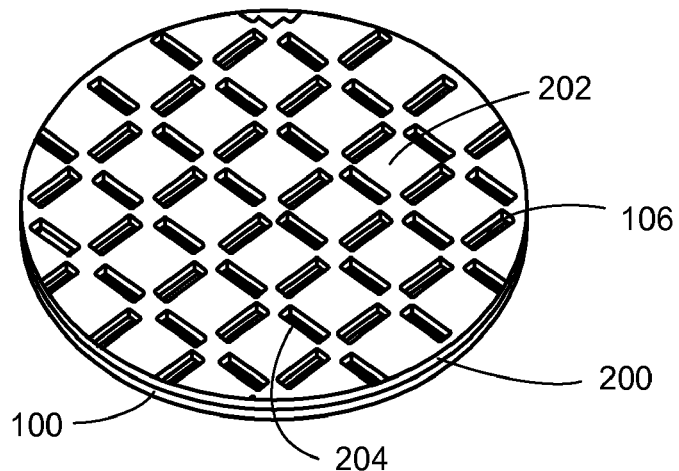
FIG. 7 is an isometric top view of a wafer level spacer formed over a substrate in accordance with an embodiment of the present invention.

Referring now to FIG. 7, therein is shown an isometric top view of the wafer level spacer 200 formed over the substrate 100 in accordance with an embodiment of the present invention. Generally, the wafer level spacer 200 is designed to match the dimensions of the substrate 100 and provide a one-step spacer attach sequence. More specifically, each of the unit spacers 202 and each of the apertures 204 are designed to substantially align over each of the devices 102, of FIG. 1, and each of the scribe lines 106, respectively. The wafer level spacer 200 can be attached to the substrate 100 by adhesives well known within the art and not repeated herein.

Although the apertures 204 are depicted as rectangular in shape, they may be any shape necessary to permit access to the electrical contact points located on the devices 102. Additionally, although not depicted, the wafer level spacer 200 may contain one or more of the punch holes 600, of FIG. 6.

After the wafer level spacer 200 is attached to the substrate 100, a singulation or dicing process, such as lasing or mechanical dicing, may occur. During this process, the unit spacers 202 are singulated from the wafer level spacer 200 and the devices 102 are singulated from the substrate 100. The resultant product of the singulation or dicing process is described in more detail in FIG. 8.

Figure 8:
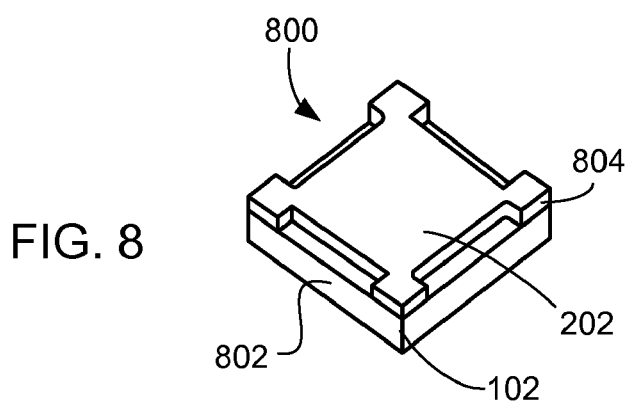
FIG. 8 an isometric top view of an integrated circuit package system in an initial stage of manufacturing in accordance with an embodiment of the present invention.

Referring now to FIG. 8, therein is shown an isometric top view of an integrated circuit package system 800 in an initial stage of manufacturing in accordance with an embodiment of the present invention. The integrated circuit package system 800 includes the device 102, after singulation from the substrate 100, of FIG. 7, and the unit spacer 202 after singulation from the wafer level spacer 200, of FIG. 7, by laser or mechanical dicing.

Notably, the device 102 will exhibit or have the characteristics of being singulated from the substrate 100 along a device edge 802, and the unit spacer 202 will exhibit or have the characteristics of being singulated from the wafer level spacer 200 along a unit spacer edge 804. The characteristics of singulation may include physical features, such as microabrasions, which are indicative of a lasing or mechanical dicing process. In at least one embodiment, after singulation, the unit spacer 202 can be substantially defined by the dimensions of the device 102, with the unit spacer edge 804 sharing a common vertical boundary with the device edge 802 along the singulation path of the scribe lines 106, of FIG. 1.

FIGS. 9-18 depict exemplary process flows for additional manufacturing process steps for the integrated circuit package system 800, such as a stacked integrated circuit package system, employing the wafer level spacer 200 (FIG. 2) in accordance with embodiments of the present invention. It is to be understood that FIGS. 9-18 depict by way of example and not by way of limitation, exemplary process flows for the formation of the stacked integrated circuit package systems, and they are not to be construed as limiting.

Figure 9:
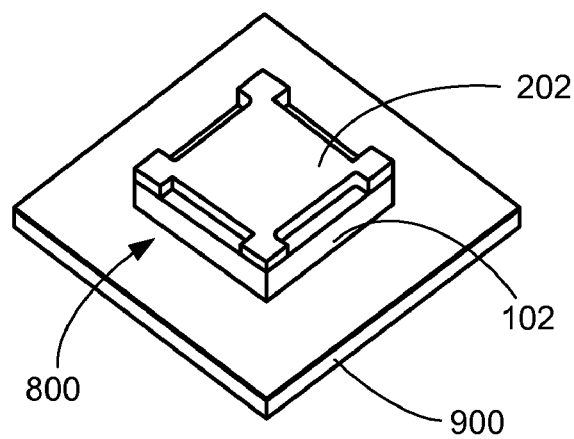
FIG. 9 is an isometric top view of an integrated circuit package system formed over a structure in accordance with an embodiment of the present invention.

Referring now to FIG. 9, therein is shown an isometric top view of the integrated circuit package system 800 formed over a structure 900 in accordance with an embodiment of the present invention. The integrated circuit package system 800 includes the device 102 and the unit spacer 202. By way of example and not by way of limitation, the structure 900 may include a second level packaging assembly, such as a leadframe or an electronic circuit formed on a printed circuit board or a printed wiring board.

During this process step the integrated circuit package system 800 is aligned to the structure 900 and attached by adhesives well known within the art and not repeated herein.

Figure 10:
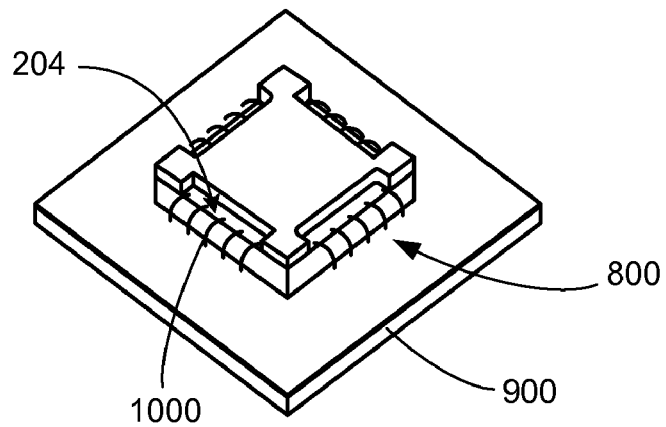
FIG. 10 is the structure of FIG. 9 after the formation of first wire bonds.

Referring now to FIG. 10, therein is shown the structure of FIG. 9 after the formation of first wire bonds 1000. The first wire bonds 1000 electrically attach the integrated circuit package system 800 to the structure 900. The size and number of the first wire bonds 1000 are currently only limited by the technology of wire bond equipment and the minimum required operating space. Alternatively, the integrated circuit package system 800 could be electrically attached to the structure 900 by surface mount technology, such as ball grid array and flip-chip technology.

Furthermore, although the present embodiment depicts the apertures 204 as rectangular in shape, the apertures 204 may be any shape that provides access to the electrical contact points located on the devices 102.

FIGS. 11-18 will refer to two different embodiments. More specifically, FIGS. 11-14 will refer to embodiment one and FIGS. 15-18 will refer to embodiment two.

Embodiment One

Figure 11:
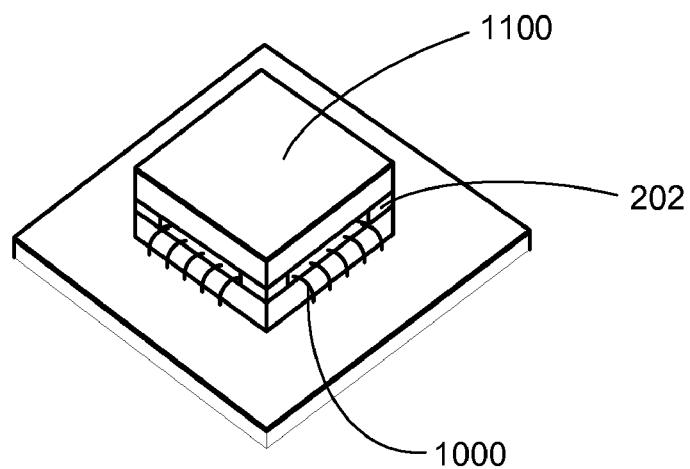
FIG. 11 is the structure of FIG. 10 after the attachment of a spacer-less second device.

Referring now to FIG. 11, therein is shown the structure of FIG. 10 after the attachment of a spacer-less second device 1100. The spacer-less second device 1100 is aligned over and attached to the unit spacer 202 by adhesives well known within the art and not repeated herein. The spacer-less second device 1100 can be used as a top or capping device. Alternatively, the spacer-less second device 1100 can be used when additional active or passive components stacked above are smaller. Although not shown, if tolerance clearances for the first wire bonds 1000 become an issue, an insulating layer can be placed on the bottom surface of the spacer-less second device 1100 adjacent the unit spacer 202 for prevention of electrical shorting.

The spacer-less second device 1100 may include semiconductor chips and integrated circuit packages selected from active components, passive components, surface mount components, stacked components, and so forth, in numerous configurations and arrangements as may be needed.

By way of example and not by way of limitation, the spacer-less second device 1100 may more specifically include quad-flat non-leaded packages, wire bond packages, single and dual-side memory packages, internal stacking module packages, modular packages, application-specific-integrated-circuit (ASIC) packages, stacked die packages or a combination thereof. Furthermore, the spacer-less second device 1100 may further include, by way of example and not by way of limitation, wire bond die, stacked die, modular die, ASIC die, passive devices or a combination thereof.

Additionally, the present invention includes semiconductor package configurations, such as package-in-package (PiP) and package-on-package configurations (PoP). The PiP system is a 3D package system that stacks a fully tested Internal Stacking Module (ISM) on top of a Base Assemble Package (BAP) to form a single Chip Scale Package (CSP). PoP is a 3D package in which fully tested packages are stacked on top of another single or stacked package during the board mount process. As an exemplary illustration, the spacer-less second device 1100 may include PiP and PoP configurations.

However, it is to be understood that the spacer-less second device 1100 of the present invention cover a wide range of package and die configurations, and the type of package or die configuration employed is only limited by the design specifications of the chosen integrated circuit package system.

Figure 12:
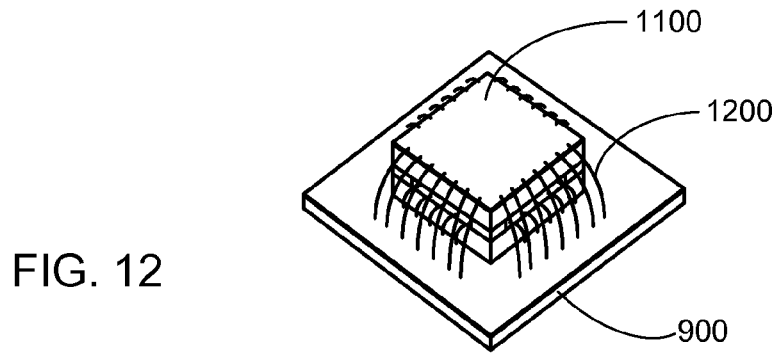
FIG. 12 is the structure of FIG. 11 after the formation of second wire bonds.

Referring now to FIG. 12, therein is shown the structure of FIG. 11 after the formation of second wire bonds 1200. The second wire bonds 1200 electrically attach the spacer-less second device 1100 to the structure 900. The size and number of the second wire bonds 1200 are currently only limited by the technology of wire bond equipment and the minimum required operating space.

Figure 13:
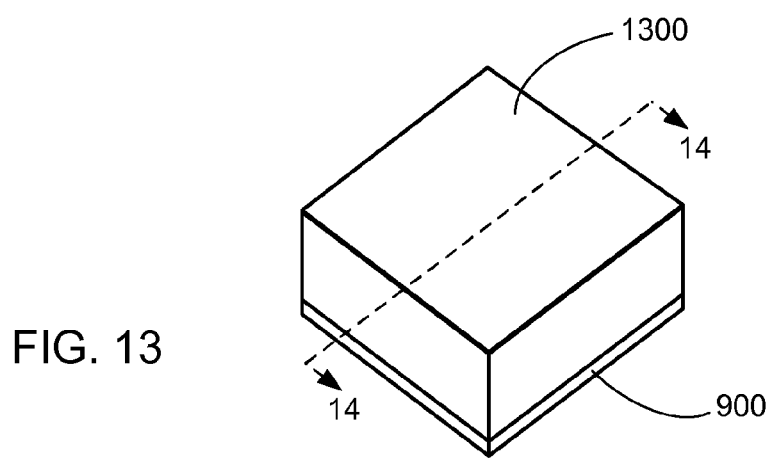
FIG. 13 is the structure of FIG. 12 after the formation of an encapsulating material.

Referring now to FIG. 13, therein is shown the structure of FIG. 12 after the formation of an encapsulating material 1300. The encapsulating material 1300, such as a molding compound, is deposited over the device 102, of FIG. 9, the unit spacer 202, of FIG. 9, the structure 900, the first wire bonds 1000, of FIG. 10, the spacer-less second device 1100, of FIG. 11, and the second wire bonds 1200, of FIG. 12. The encapsulating material 1300 and molding techniques using it are well known in the art and not repeated herein. Although, the present embodiment depicts the formation of the encapsulating material 1300 after the formation of the second wire bonds 1200, one or more additional active or passive components, such as the integrated circuit package system 800, of FIG. 8, can be formed over the spacer-less second device 1100 before formation of the encapsulating material 1300.

Figure 14:
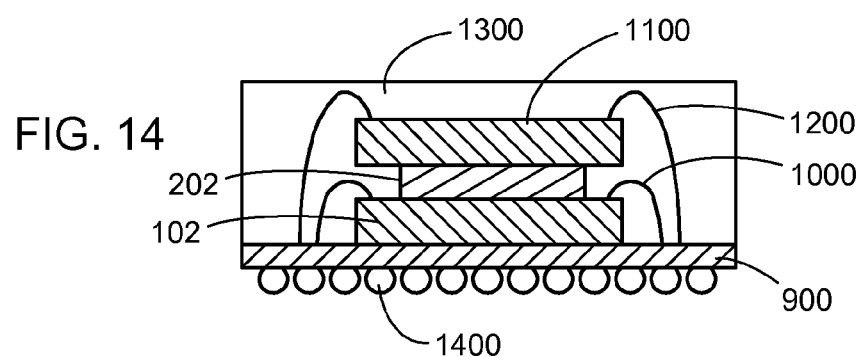
FIG. 14 is a cross-sectional view of FIG. 13 along line 14-14 in accordance with an embodiment of the present invention.

Referring now to FIG. 14, therein is shown a cross-sectional view of FIG. 13 along line 14-14 in accordance with an embodiment of the present invention. This view illustrates the device 102, the unit spacer 202, the structure 900, the first wire bonds 1000, the spacer-less second device 1100, the second wire bonds 1200, the encapsulating material 1300, and external electrical contacts 1400. By way of example, the external electrical contacts 1400 may establish an electrical connection to external circuitry, such as another printed circuit board or additional package configurations.

Embodiment Two

Figure 15:
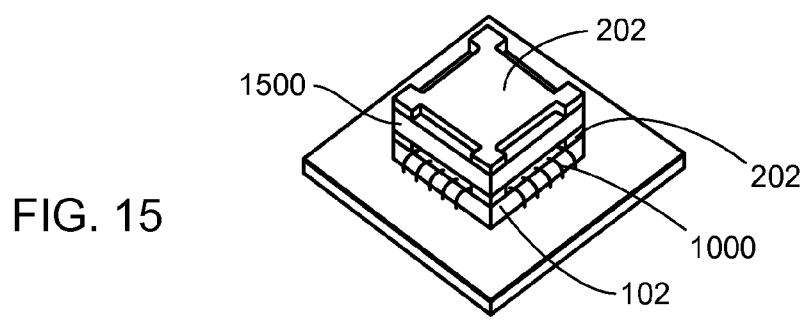
FIG. 15 is the structure of FIG. 10 after the attachment of a second device to the device.

Referring now to FIG. 15, therein is shown the structure of FIG. 10 after the attachment of a second device 1500 to the device 102. The second device 1500 is aligned over and attached to one of the unit spacers 202 by adhesives well known within the art and not repeated herein. One of the unit spacers 202 is formed between the device 102 and the second device 1500 and another one of the unit spacers 202 is formed above the second device 1500. The second device 1500 can be used as a top or capping device. Alternatively, the second device 1500 can be used when additional active or passive components are to be stacked over the second device 1500.

Although not shown, if tolerance clearances for the first wire bonds 1000 become an issue, an insulating layer can be placed on the bottom surface of the second device 1500 adjacent the unit spacer 202, formed over the device 102, for prevention of electrical shorting.

The second device 1500 may include semiconductor chips and integrated circuit packages selected from active components, passive components, surface mount components, stacked components, and so forth, in numerous configurations and arrangements as may be needed.

By way of example and not by way of limitation, the second device 1500 may more specifically include quad-flat non-leaded packages, wire bond packages, single and dual-side memory packages, internal stacking module packages, modular packages, application-specific-integrated-circuit (ASIC) packages, stacked die packages or a combination thereof. Furthermore, the second device 1500 may further include, by way of example and not by way of limitation, wire bond die, stacked die, modular die, ASIC die, passive devices or a combination thereof.

Additionally, the present invention includes semiconductor package configurations, such as package-in-package (PiP) and package-on-package configurations (PoP). The PiP system is a 3D package system that stacks a fully tested Internal Stacking Module (ISM) on top of a Base Assemble Package (BAP) to form a single Chip Scale Package (CSP). PoP is a 3D package in which fully tested packages are stacked on top of another single or stacked package during the board mount process. As an exemplary illustration, the second device 1500 may include PiP and PoP configurations.

However, it is to be understood that the second device 1500 of the present invention cover a wide range of package and die configurations, and the type of package or die configuration employed is only limited by the design specifications of the chosen integrated circuit package.

Figure 16:
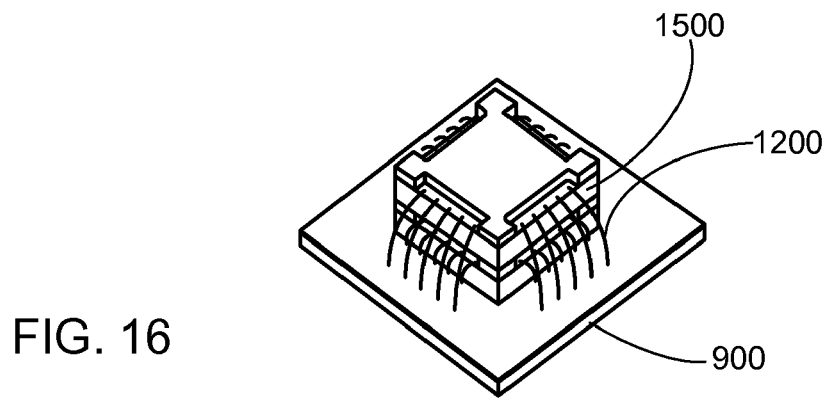
FIG. 16 is the structure of FIG. 15 after the formation of second wire bonds.

Referring now to FIG. 16, therein is shown the structure of FIG. 15 after the formation of the second wire bonds 1200. The second wire bonds 1200 electrically attach the second device 1500 to the structure 900. The size and number of the second wire bonds 1200 are currently only limited by the technology of wire bond equipment and the minimum required operating space.

Figure 17:
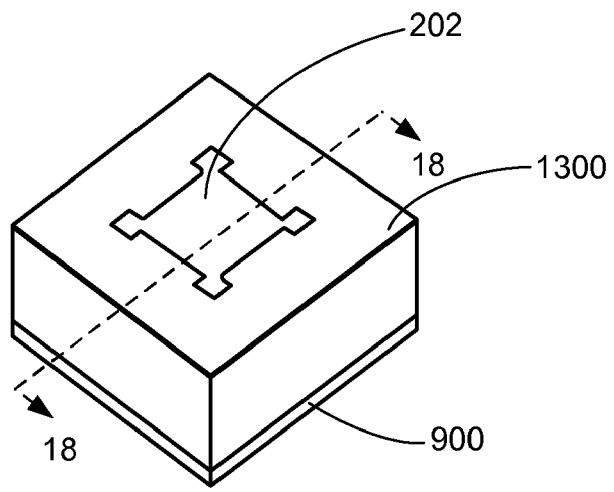
FIG. 17 is the structure of FIG. 16 after the formation of an encapsulating material.

Referring now to FIG. 17, therein is shown the structure of FIG. 16 after the formation of the encapsulating material 1300. The encapsulating material 1300, such as a molding compound, is deposited to encapsulate the device 102, of FIG. 9, the unit spacer 202, the structure 900, the first wire bonds 1000, of FIG. 10, the second wire bonds 1200, of FIG. 12, and the second device 1500, of FIG. 15. The encapsulating material 1300 and molding techniques using it are well known in the art and not repeated herein. Although, the present embodiment depicts the formation of the encapsulating material 1300 after the formation of the second wire bonds 1200, one or more additional active or passive components, such as the integrated circuit package system 800, of FIG. 8, can be formed over the second device 1500 before formation of the encapsulating material 1300.

Additionally, the unit spacer 202 formed over the second device 1500 can be used as a detection point for determining appropriate deposition of the encapsulating material 1300. For example, the height of the unit spacer 202 formed over the second device 1500 can be chosen based upon loop height of the second wire bonds 1200, and subsequent deposition of the encapsulating material 1300 using the unit spacer 202 as a detection point will ensure encapsulation of the second wire bonds 1200. Furthermore, by way of example, the unit spacer 202 formed over the second device 1500 may serve as an end point detection for subsequent planarization or etching of the encapsulating material 1300.

Figure 18:
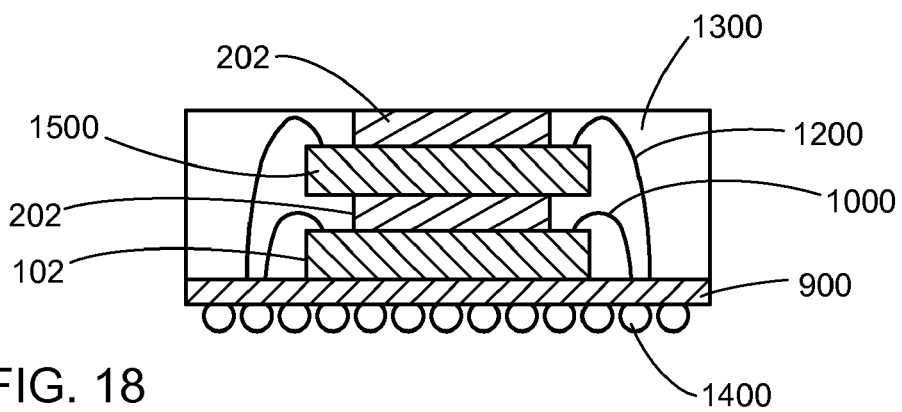
FIG. 18 is a cross-sectional view of FIG. 17 along line 18-18 in accordance with an embodiment of the present invention.

Referring now to FIG. 18, therein is shown a cross-sectional view of FIG. 17 along line 18-18 in accordance with an embodiment of the present invention. This view illustrates the device 102, the unit spacers 202, the structure 900, the first wire bonds 1000, the second wire bonds 1200, the encapsulating material 1300, the external electrical contacts 1400, and the second device 1500. By way of example, the external electrical contacts 1400 may establish an electrical connection to external circuitry, such as another printed circuit board or additional package configurations.

Figure 19:
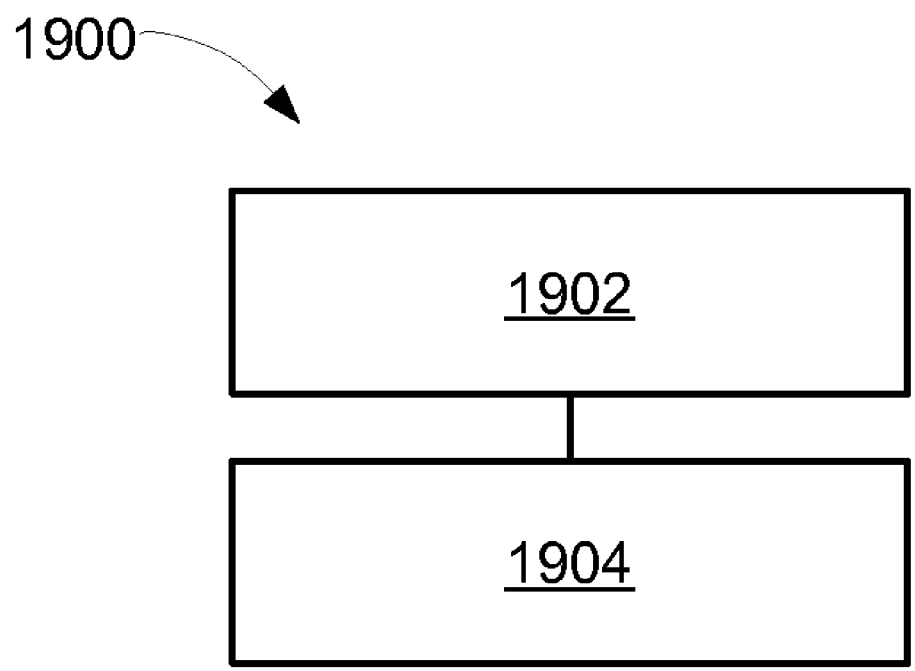
FIG. 19 is a flow chart for an integrated circuit package system for fabricating the integrated circuit package system in accordance with an embodiment of the present invention.

Referring now to FIG. 19, therein is shown a flow chart for an integrated circuit package system 1900 for fabricating the integrated circuit package system 800 in accordance with an embodiment of the present invention. The integrated circuit package system 1900 includes providing a wafer level spacer that includes apertures, which define unit spacers that are interconnected in a block 1902; and configuring the unit spacers to substantially align over devices formed within a substrate in a block 1904.

It has been discovered that the present invention thus has numerous aspects. A principle aspect is that the overall stack-up height of a vertically stacked integrated circuit package system can be reduced by employing a wafer level spacer.

Another aspect of the present invention is that the number of process steps used in forming a vertically stacked integrated circuit package system can be reduced. Consequently, the time and cost of producing such a system can be reduced.

Another aspect of the present invention is that same size die stacking can be employed when using the wafer level spacer.

Another aspect of the present invention is that the wafer level spacer can provide each integrated circuit package system with a unit spacer that enhances thermal dissipation.

Another aspect of the present invention is that the wafer level spacer can provide each integrated circuit package system with a unit spacer that blocks electromagnetic radiation between adjacent systems.

Yet still, another aspect of the present invention is that the wafer level spacer provides additional structural support to an underlying or overlying substrate/device and thereby prevents warpage of either.

These and other valuable aspects of the present invention consequently further the state of the technology to at least the next level.

Thus, it has been discovered that the integrated circuit package system of the present invention furnishes important and heretofore unknown and unavailable solutions, capabilities, and functional aspects. For instance, by employing an integrated circuit package system including a wafer level spacer, the overall stack-up height of the package system can be reduced, process steps can be eliminated, and additional structural support is afforded to the package system that prevents substrate or device warpage failure. The resulting processes and configurations are straightforward, cost-effective, uncomplicated, highly versatile and effective, can be implemented by adapting known technologies, and are thus readily suited for efficient and economical manufacturing.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations, which fall within the scope of the included claims. All matters hithertofore set forth herein or shown in the accompanying drawings are to be interpreted in an illustrative and non-limiting sense.

What is claimed is:

1. A method of manufacture of an integrated circuit package system comprising:
    providing a wafer level spacer that includes a notch for orientation and apertures, which define unit spacers joined together by material of the wafer level spacer;
    configuring the unit spacers to substantially align over semiconductor chips formed within a substrate; and
    dicing to form a common vertical boundary shared by the unit spacers and the devices, semiconductor chips.

2. The method as claimed in claim 1 further comprising:
    forming the apertures to include shapes selected from circles, ellipses, rectangles, squares, or poly-sided openings.

3. The method as claimed in claim 1 further comprising:
    forming the apertures to align with scribe lines formed on the substrate.

4. The method as claimed in claim 1 further comprising:
    attaching each of the unit spacers to the substrate in a single step.

5. The method as claimed in claim 1 wherein:
    providing the wafer level spacer includes a wafer selected from material that prevents warpage failure, enhances thermal dissipation, or blocks electromagnetic radiation.

6. A method of manufacture of an integrated circuit package system comprising:
provviding a wafer level spacer including apertures that define unit spacers joined together by material of the wafer level spacer;
aligning the wafer level spacer via a notch for orientation over a substrate with semiconductor chips;
dicing the wafer level spacer and the substrate to form a common vertical boundary shared by one of the unit spacers and one of the semiconductor chips; and
forming one of the unit spacers over one of the semiconductor chips.

7. The method as claimed in claim 6 wherein:
aligning the wafer level spacer over the substrate forms the unit spacers over each of the semiconductor chips in a single step.

8. The method as claimed in claim 6 further comprising:
selecting the semiconductor chips from active components, passive components, or a combination thereof.

9. The method as claimed in claim 6 further comprising:
stacking a spacer-less device over one of the semiconductor chips.

10. The method as claimed in claim 6 further comprising:
stacking a device over one of the semiconductor chips.

11. An integrated circuit package system comprising:
a semiconductor chip having the characteristics of being singulated from a substrate;
a unit spacer over the semiconductor chip sharing a common vertical boundary with the semiconductor chip, the unit spacer having the characteristics of being singulated from a wafer level spacer including a notch for orientation; and
apertures formed along the perimeter of the unit spacer.

12. The system as claimed in claim 11 wherein:
the apertures include shapes selected from circles, ellipses, rectangles, squares, or poly-sided openings.

13. The system as claimed in claim 11 wherein:
the apertures align with scribe lines formed on the substrate.

14. The system as claimed in claim 11 wherein:
the wafer level spacer includes a punch hole.

15. The system as claimed in claim 11 wherein:
the wafer level spacer includes a wafer selected from material that prevents warpage failure, enhances thermal dissipation, or blocks electromagnetic radiation.

16. The system as claimed in claim 11 wherein:
the semiconductor chip includes wire bond die, flip-chip die, stacked die, modular die, ASIC die, passive devices or a combination thereof.

17. The system as claimed in claim 11 wherein:
the semiconductor chip is attached to a structure.

18. The system as claimed in claim 11 further comprising:
a spacer-less device over the semiconductor chip.

19. The system as claimed in claim 11 further comprising:
a device over the semiconductor chip.

* * * * *

UNITED STATES PATENT AND TRADEMARK OFFICE
CERTIFICATE OF CORRECTION

PATENT NO. : 8,039,365 B2
APPLICATION NO. : 11/456845
DATED : October 18, 2011
INVENTOR(S) : Lee et al.

It is certified that error appears in the above-identified patent and that said Letters Patent is hereby corrected as shown below:

Column 1:
lines 7-9, after Title and before the Technical Field delete:
"CROSS-REFERENCE TO RELATED APPLICATION(S)
The present application contains subject matter related to co-pending U.S. patent application Ser. No. 11/465,706, filed Aug. 18, 2006."

Column 2:
lines 41-42, add double dashes between numbers 14-14 as follows: delete "line 14-14 in accordance" and insert therefor --line 14--14 in accordance-- lines 50-51, add double dashes between numbers 18-18 as follows: delete "line 18-18 in accordance" and insert therefor --line 18--18 in accordance--

Column 5:
line 19, delete "in FIGS. 3-5." and insert therefor --in FIGs. 3-5.-- line 34, delete "FIGS. 3-5 depict" and insert therefor --FIGs. 3-5 depict--

Column 6:
line 47, delete "FIGS. 9-18 depict" and insert therefor --FIGs. 9-18 depict--

Column 7:
line 15, delete "FIGS. 11-18 will refer" and insert therefor --FIGs. 11-18 will refer-- lines 16-17, delete "FIGS. 11-18 will refer to two different embodiments. More specifically, FIGS. 11-14 will refer to embodiment one and FIGS. 15-18 will refer" and insert therefor --FIGs. 11-18 will refer to two different embodiments. More specifically, FIGs. 11-14 will refer to embodiment one and FIGs. 15-18 will refer--

Signed and Sealed this
Twelfth Day of June, 2012

David J. Kappos
*Director of the United States Patent and Trademark Office*

Column 8:
line 20, add double dashes between numbers 14-14 as follows: delete "line 14-14 in accordance" and insert therefor --line 14--14 in accordance--

Column 9:
line 46, add double dashes between numbers 18-18 as follows: delete "line 18-18 in accordance" and insert therefor --line 18--18 in accordance--

Column 10:
line 52, delete "and the devices, semiconductor chips." and insert therefor --and the semiconductor chips.--